US009391638B1

(12) United States Patent
Metuki

(10) Patent No.: US 9,391,638 B1
(45) Date of Patent: Jul. 12, 2016

(54) ERROR INDICATIONS IN ERROR CORRECTION CODE (ECC) PROTECTED MEMORY SYSTEMS

(71) Applicant: Marvell Israel (M.I.S.L.) Ltd., Yokneam (IL)

(72) Inventor: Assaf Metuki, Moshav Herut (IL)

(73) Assignee: Marvell Israel (M.I.S.L) Ltd., Yokneam (IL)

( * ) Notice: Subject to any disclaimer, the term of this patent is extended or adjusted under 35 U.S.C. 154(b) by 281 days.

(21) Appl. No.: 13/670,628

(22) Filed: Nov. 7, 2012

Related U.S. Application Data

(60) Provisional application No. 61/558,379, filed on Nov. 10, 2011.

(51) Int. Cl.
| | |
|---|---|
| *H03M 13/00* | (2006.01) |
| *H03M 13/11* | (2006.01) |
| *H03M 13/09* | (2006.01) |
| *G06F 11/10* | (2006.01) |
| *H04L 1/00* | (2006.01) |

(52) U.S. Cl.
CPC ........... *H03M 13/11* (2013.01); *G06F 11/1056* (2013.01); *H03M 13/09* (2013.01); *H04L 1/0057* (2013.01); *H04L 1/0061* (2013.01)

(58) Field of Classification Search
CPC ... H03M 13/11; H03M 13/09; H03M 13/091; H03M 13/093; H03M 13/1108; H03M 3/51; H03M 7/28; H04L 1/0061; H04L 1/0057; G06F 11/1056
USPC .................. 714/758, 777, 800, 779, 765, 763
See application file for complete search history.

(56) References Cited

U.S. PATENT DOCUMENTS

| | | | | |
|---|---|---|---|---|
| 3,836,957 A | * | 9/1974 | Duke ................. | G06F 11/1048 714/765 |
| 4,884,271 A | * | 11/1989 | Concha ............... | G06F 11/1056 714/764 |
| 4,980,888 A | * | 12/1990 | Bruce .................... | G11C 29/42 714/718 |
| 5,014,273 A | * | 5/1991 | Gagliardo ........... | G06F 11/1056 714/719 |
| 6,035,432 A | * | 3/2000 | Jeddeloh ............. | G11C 29/765 714/710 |
| 6,233,702 B1 | * | 5/2001 | Horst ............... | G01R 31/31727 711/E12.026 |
| 7,243,291 B1 | * | 7/2007 | Williams .............. | G09G 5/006 714/758 |
| 7,328,365 B2 | * | 2/2008 | Karpuszka .......... | G06F 11/1056 714/6.2 |
| 2002/0124222 A1 | * | 9/2002 | Lippincott ............. | H03M 7/30 714/758 |
| 2004/0168103 A1 | * | 8/2004 | Biskup ............... | G11B 20/1816 714/6.13 |

(Continued)

*Primary Examiner* — Albert Decady
*Assistant Examiner* — Osman M Alshack

(57) ABSTRACT

Some of the embodiments of the present disclosure provide a method including receiving data to be stored in a memory, the data including (i) data bits and (ii) a tag indicating that one or more of the data bits are corrupted; generating eight error correction code (ECC) bits corresponding to the data bits of the data; in response to the data including the tag indicating that one or more of the data bits are corrupted, modifying seven bits of the eight ECC bits to generate modified ECC bits, wherein the seven bits of the eight ECC bits are modified to indicate that one or more of the corresponding data bits are corrupted; and writing the data bits, along with the modified ECC bits, to the memory. Other embodiments are also described and claimed.

23 Claims, 3 Drawing Sheets

(56) References Cited

U.S. PATENT DOCUMENTS

| | | | | |
|---|---|---|---|---|
| 2004/0225935 A1* | 11/2004 | Tsao | ................ | G11C 29/52 714/718 |
| 2005/0034052 A1* | 2/2005 | Das Sharma | ...... | H03M 13/2918 714/800 |
| 2007/0150790 A1* | 6/2007 | Gross | ................ | G06F 11/1044 714/763 |
| 2008/0021702 A1* | 1/2008 | Chen | .................... | G10L 19/005 704/201 |
| 2010/0309908 A1* | 12/2010 | Dolkas | ................ | H04L 12/2697 370/389 |
| 2011/0138252 A1* | 6/2011 | Pawlowski | .......... | G06F 11/1044 714/763 |
| 2011/0185251 A1* | 7/2011 | d'Abreu | ................ | G06F 11/1072 714/752 |
| 2012/0239996 A1* | 9/2012 | Higeta | ................ | G06F 11/1048 714/746 |

\* cited by examiner

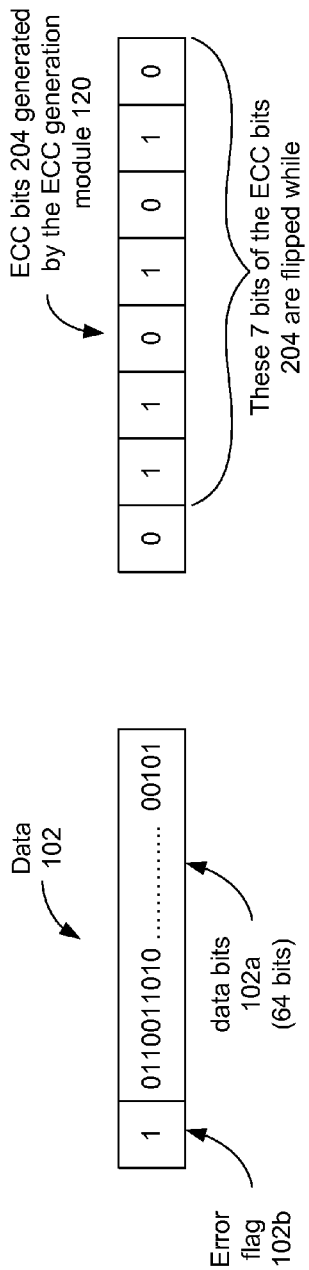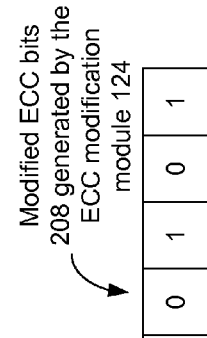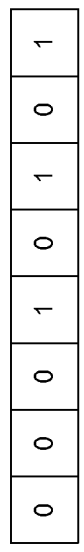

ERROR INDICATIONS IN ERROR CORRECTION CODE (ECC) PROTECTED MEMORY SYSTEMS

CROSS REFERENCE TO RELATED APPLICATIONS

The present application claims priority to U.S. Patent Application No. 61/558,379, filed on Nov. 10, 2011, the entire specification of which is hereby incorporated by reference in its entirety.

TECHNICAL FIELD

Embodiments of the present disclosure relate to memory systems, and more specifically, to error correction code (ECC) protected memory systems.

BACKGROUND

Unless otherwise indicated herein, the approaches described in this section are not prior art to the claims in the present disclosure and are not admitted to be prior art by inclusion in this section.

Various computing systems generate error correction codes so that the validity of transmitted data can be confirmed. Sometimes however, even though received data may have become corrupted during transmission, the corrupted received data nevertheless needs to be stored in a memory, for example so as not to disrupt a processing flow. For example, care is required to ensure that corrupted data is not inadvertently processed.

SUMMARY

In various embodiments, the present disclosure provides a method comprising receiving data to be stored in a memory, the data including (i) data bits and (ii) a tag indicating that one or more of the data bits are corrupted; generating eight error correction code (ECC) bits corresponding to the data bits of the data; in response to the data including the tag indicating that one or more of the data bits are corrupted, modifying seven bits of the eight ECC bits to generate modified ECC bits, wherein the seven bits of the eight ECC bits are modified to indicate that one or more of the corresponding data bits are corrupted; and writing the data bits, along with the modified ECC bits, to the memory.

In an embodiment, there is also provided a method comprising a system comprising a memory; and a memory controller coupled to the memory, the memory controller comprising a data reception module configured to receive data to be stored in the memory, the data including (i) data bits and (ii) a tag indicating that one or more of the data bits are corrupted, an error correction code (ECC) generation module configured to generate eight ECC bits corresponding to the data bits of the data, an ECC modification module configured to modify, in response to the data including the tag indicating that one or more of the data bits are corrupted, seven bits of the eight ECC bits to generate modified ECC bits, wherein the seven bits of the eight ECC bits are modified to indicate that one or more of the corresponding data bits are corrupted, and a write module configured to write the data bits, along with the modified ECC bits, to the memory.

BRIEF DESCRIPTION OF THE DRAWINGS

In the following detailed description, reference is made to the accompanying drawings which form a part hereof wherein like numerals designate like parts throughout, and in which is shown by way of embodiments that illustrate principles of the present disclosure. It is noted that other embodiments may be utilized and structural or logical changes may be made without departing from the scope of the present disclosure. Therefore, the following detailed description is not to be taken in a limiting sense, and the scope of embodiments in accordance with the present disclosure is defined by the appended claims and their equivalents.

FIG. 2A illustrates an example of data comprising 64 data bits and a single bit error flag, in accordance with an embodiment of the present disclosure.

FIG. 2B illustrates modifying error correction code (ECC) bits generated by an ECC generation module, in accordance with an embodiment of the present disclosure.

FIG. 2C illustrates concatenating data bits and modified ECC bits to form write data, in accordance with an embodiment of the present disclosure.

DETAILED DESCRIPTION

Figure 1:
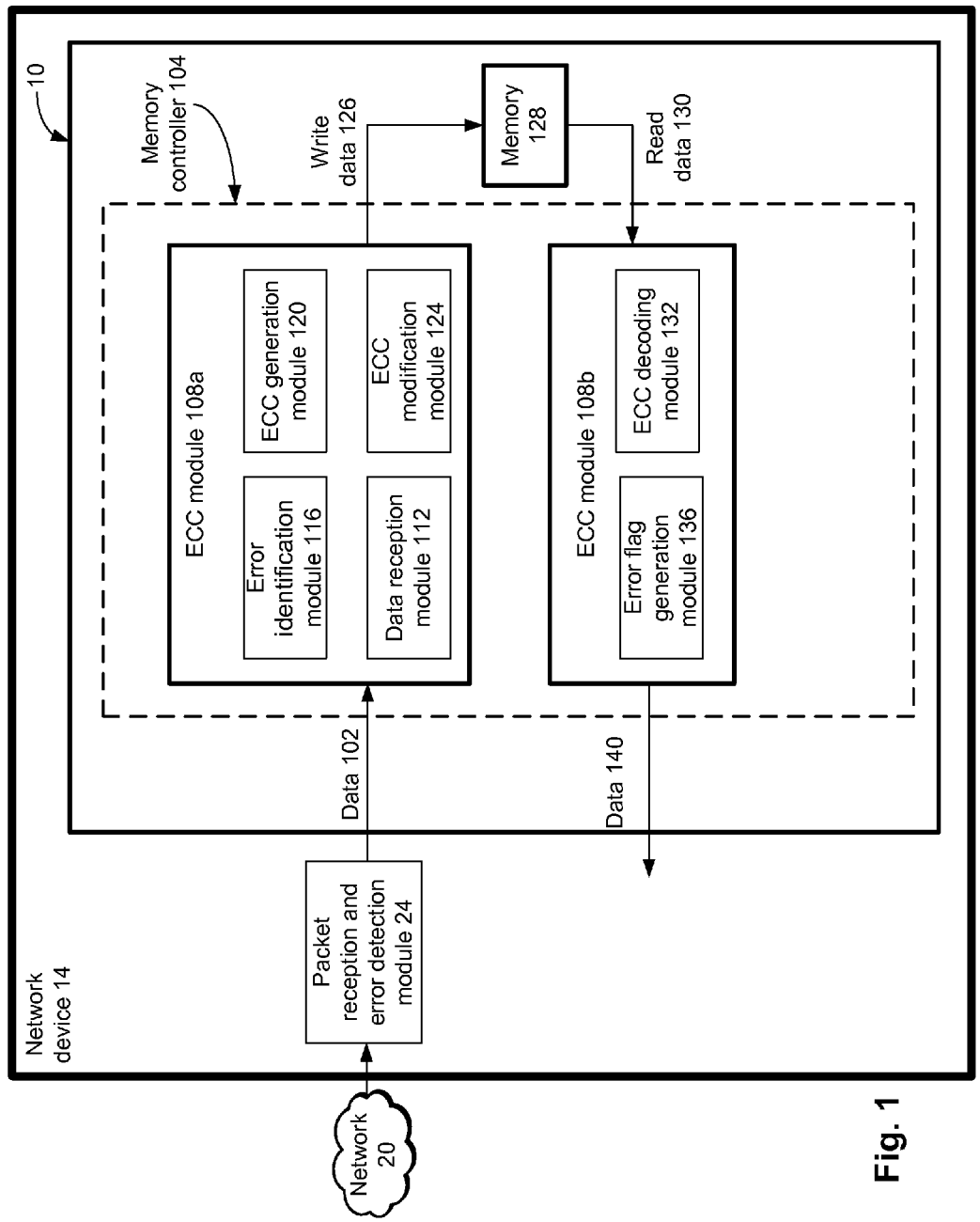
FIG. 1 schematically illustrates a memory system comprising a memory controller coupled to a memory, in accordance with an embodiment of the present disclosure.

FIG. 1 schematically illustrates a memory system 10 (henceforth referred to as "system 10") comprising a memory controller 104 (illustrated using dotted line) coupled to a memory 128, in accordance with an embodiment of the present disclosure. In an embodiment, the memory controller 104 comprises error correction code (ECC) modules 108a and 108b.

In an embodiment, the system 10 is included in a network device 14 coupled to a network 20 (e.g., the Internet, an intranet, and/or the like). The network device 14 comprises a packet reception and error detection module 24 configured to receive a stream of data packets from the network 20. For example, the packet reception and error detection module 24 comprises one or more data ports to receive the stream of data packets from the network 20. The packet reception and error detection module 24 also processes the stream of data packets. In an embodiment, the data packets include ECC bits, which are decoded by the packet reception and error detection module 24. In response to detecting error in a data packet, the packet reception and error detection module 24 tags the data packet as being corrupted. The packet reception and error detection module 24 transmits the data packets (e.g., with or without tagging the data packets as being corrupted) to the system 10, for storage in the memory 128.

The ECC module 108a receives data 102 (e.g., from the packet reception and error detection module 24, or from another appropriate source) for storing in the memory 128. The data 102 includes (i) data bits (e.g., 64 data bits) and (ii) a tag (e.g., in the form of an error flag) indicating that one or more of the data bits are corrupted (e.g., are erroneous), although, in an embodiment, such a tag does not identify a number of data bits (or positions of the data bits) that are corrupted. The ECC module 108a generates ECC bits corresponding to the data bits of the received data 102 (e.g., generates eight ECC bits corresponding to the 64 data bits of the data 102). In an embodiment, in response to the tag on received data 102 indicating that one or more of the data bits of the data 102 are corrupted, the ECC module 108a modifies seven bits of the eight ECC bits to generate modified ECC bits (e.g., each of the seven ECC bits are flipped from 0 to 1, or from 1 to 0). The seven bits of the eight ECC bits are modified, for example, to intentionally introduce significant error in the ECC bits and to indicate that the corresponding data 102 is corrupted. The memory controller 104 writes the 64 data bits of the data 102 and the modified ECC bits (labeled as write data 126 in FIG. 1) to the memory 128.

The ECC module 108b reads from the memory 128 read data 130, which corresponds to the write data 126 that was earlier written to the memory 128. The ECC module 108b decodes the ECC bits of the read data 130. While writing the write data 126 to the memory 128, while the write data 126 is being stored in the memory 128, and/or while reading the read data 130 from the memory 128, an error may be introduced in a data bit and/or an ECC bit (e.g., the bit may be flipped). However, as seven bits of the eight bit ECC were earlier modified, even if one of the seven modified ECC bits is flipped back to it's original value, several other bits of the ECC bits in the read data 130 would still be erroneous (e.g., would not correspond to the data bits included in the read data 130) and upon decoding would still indicate that the read data is corrupted. Accordingly, while decoding the read data 130, the ECC module 108b detects error in the read data 130, and such an error, with high probability, is beyond a correction capability of the ECC module 108b (e.g., as several of the ECC bits corresponding to the data bits 102 have been modified, and are erroneous). Thus, the ECC module 108b identifies the read data 130 as being erroneous and beyond correction. Accordingly, the ECC module 108b generates an error flag, which indicates that the data bits of the read data 130 are erroneous. The ECC module 108b appends the error flag with the data bits of the read data 130 to generate data 140 (as illustrated in FIG. 1), and transmits the data 140 to an appropriate destination. Thus, by flipping seven of the eight bits in the ECC, corrupted data is strongly encoded to indicate that it is indeed corrupted.

As discussed, the data 102 includes a tag, e.g., in the form of an error flag, indicating that one or more of the data bits of the data 102 are corrupted. Such an error flag is not stored in the memory 128 along with the data bits of the data 102, in an embodiment. However, it may be desirable to preserve the information about one or more of the data bits 102a being corrupted, even while the data bits of the data 102 are written in the memory 128. Modifying the ECC bits associated with the data bits of the data 102 provides a nearly indelible mark, indicating that the data 102 is corrupted (e.g., even if one of the ECC bits is flipped back to the original value of the ECC bit). The ECC module 108b, while decoding the read data 130, detects an error in the read data 130, as several of the original ECC bits were modified (and hence, the ECC does not correspond to the data bits of the data 102). Accordingly, the ECC module 108b is able to regenerate the error flag and associate it with the data bits in the data 140. Accordingly, modifying the ECC bits helps in propagation of the error indication from the data 102 to the data 140, even though no explicit error flag is stored in the memory 128. That is, the intentional introduction of error into the ECC bits, by modifying some of the ECC bits, acts as a strongly encoded error flag and propagates the error indication from the data 102 to the data 140.

As previously alluded to, in an embodiment, the received data 102 includes a plurality of data bits (e.g., 64 data bits) and a tag indicating that one or more of the plurality of data bits are corrupted. The tag is, for example, in a form of a single bit error flag. FIG. 2A illustrates an example of the data 102 comprising 64 data bits 102a and a single bit error flag 102b. The error flag 102b indicates whether or not one or more of the data bits 102a are corrupted. For example, the error flag 102b may have a value of 1 (e.g., as in FIG. 2A) to indicate that one or more of the data bits 102a are corrupted, and may have a value of 0 to indicate otherwise (e.g., to indicate no knowledge of error in the data bits 102a).

The data bits 102a illustrated in FIG. 2A are merely examples, and do not limit the teachings of this disclosure. Furthermore, although FIG. 2A illustrates 64 data bits 102a, such a number does not limit the teachings of this disclosure. For example, the data bits 102a may comprise 32 bits, 128 bits, or any other appropriate number of bits. Furthermore, although in the example of FIG. 2A, the error flag 102b having a value of 1 indicates erroneous data and the error flag 102b having a value of 0 provides no indication of error in the data bits 102b, in another example, the opposite may also be possible (i.e., the error flag 102b having a value of 0 indicates erroneous data and the error flag 102b having a value of 1 indicates otherwise).

In an embodiment, the data 102 is received by the system 10 from an appropriate data source, e.g., from the packet reception and error detection module 24 (as illustrated in FIG. 1), from a central processing unit (CPU), a network controller, a network switch, a network router, or the like. The data source (e.g., the packet reception and error detection module 24) may be aware that one or more bits of the data bits 102a may be erroneous. For example, the data source may receive the data bits 102a over the network 20 (e.g., the Internet), and may determine (e.g., based on decoding ECC bits accompanying the data bits 102a) that one or more of the data bits 102a are erroneous. The data source, however, may not be aware of which of the data bits 102a and/or how many of the data bits 102a are corrupted (e.g., due to limitations in a detection and correction capability of the corresponding error detection and correction algorithm). To preserve the information about one or more of the data bits 102a being corrupted (e.g., so that such information may later be useful to correct or otherwise process the data bits 102a, or to ensure that the corrupted data bits 102a are not processed or discarded), the data source may appropriately set the error flag 102b to indicate that the data bits 102a are corrupted.

Referring again to FIG. 1, in an embodiment, the ECC module 108a comprises a data reception module 112 and an error identification module 116. The data reception module 112 receives the data 102 from the data source. In an embodiment, the error identification module 116 identifies and processes the error flag 102b included in the data 102, and determines whether the data bits 102a include one or more errors (e.g., determines whether the data bits 102a are corrupted). As an example, the error flag 102b having a value of 1 indicates that one or more of the data bits 102a are erroneous, and the error flag 102b having a value of 0 provides no indication of error in the data bits 102a. As previously discussed, although the error flag 102b having a value of 1 indicates that one or more of the data bits 102a are corrupted, the error flag 102b does not provide any indication about a number and position of the bits in the data bits 102a that are erroneous.

In another embodiment, the error identification module 116 may receive the data bits 102a from the network 20, e.g., without the packet reception and error detection module 24 attaching the error flag 102b to the data bits 102a. In such an embodiment, the data bits 102a may include, or be associated with ECC bits received from the network 20 along with the data bits 102a. The error identification module 116 decodes the data bits 102a (e.g., using ECC bits received from the network 20, along with the data bits 102a) and identifies an error in the data bits 102.

The ECC module 108a further comprises an ECC generation module 120 configured to generate ECC bits corresponding to the data bits 102a of the data 102 (although in another embodiment, ECC bits (received from the network 20) may accompany the received data bits 102a received by the system 10, and the received ECC bits may be re-used). FIG. 2B illustrates example ECC bits 204 generated by the ECC generation module 120. In the examples of FIGS. 2A and 2B, the data bits 102a are 64 bits, and the ECC bits 204 generated by the ECC module 120 are eight bits in length (although in another example, any other number of ECC bits may be generated based on the ECC algorithm used).

The ECC generation module 120 uses an appropriate ECC algorithm to generate the ECC bits 204. For example, the ECC generation module 120 uses hamming code or the like to generate the ECC bits 204.

The ECC module 108a further comprises an ECC modification module 124 configured to selectively modify one or more of the ECC bits 204 generated by the ECC generation module 120. The ECC modification module 124 modifies the ECC bits 204 corresponding to the data bits 102a if the error flag 102b indicates that the data bits 102a of the data 102 are corrupted. For example, in response to the error identification module 116 identifying corruption in the data 102 (e.g., based on the error flag 102b), the ECC modification module 124 modifies the ECC bits 204. The ECC modification module 124 selectively modifies the ECC bits 204 to generate modified ECC bits 208, as illustrated in FIG. 2B. If the error flag 102b is 0 (i.e., no indication of error in the data 102), then the ECC modification module 124 does not modify the ECC bits 204.

In an embodiment, the ECC modification module 124 modifies at least a threshold number of bits in the ECC bits 204, where the threshold number is, for example, seven (e.g., if the ECC bits 204 comprises eight bits, as illustrated in FIG. 2B). In another example, the threshold number is three. In an embodiment, the ECC modification module 124 modifies exactly seven bits of the eight ECC bits 204. In an embodiment, the ECC modification module 124 modifies at least a threshold number of bits, where the threshold number is based on a detection and/or correction capability of the ECC algorithm used by the ECC generation module 120.

The ECC modification module 124 modifies N bits in the ECC bits 204 (e.g., where N is an integer and is equal to, for example, seven in FIG. 2B) by, for example, flipping each of the N bits. For example, in FIG. 2B, the ECC modification module 124 modifies the seven least significant bits (LSBs) in the ECC bits 204 to generate the modified ECC bits 208 by, for example, flipping the value of each of the seven LSBs (e.g., flipping a value of 0 to 1, and a value of 1 to 0). In another example, the seven most significant bits (MSBs) of the ECC bits 204 are modified. In yet another example, seven bits of the eight ECC bits 204 are randomly or pseudo randomly selected and then modified.

Once the modified ECC bits 208 are generated, the data bits 102a and the modified ECC bits 208 are concatenated to form the write data 126, as illustrated in FIG. 2C. Also, as previously discussed, if the error flag 102b is indicative of no error in the data 102 (for example, "0" in the example above), then the ECC modification module 124 does not modify the ECC bits 204, and the data bits 102a and the ECC bits 204 are then concatenated to form the write data 126. Thus, the write data 126 comprises 72 bits—(i) 64 bits from of the data bits 102a and (ii) eight bits from either the modified ECC bits 208 or the ECC bits 204 (e.g., based on the error flag 102b). It is noted that in an embodiment the error flag 102b is not included in the write data 126. Rather, only the data bits 102a from the data 102 are included in the write data 126 (along with the ECC bits 204 or the modified ECC bits 208). In another embodiment, ECC bits are received (e.g., from the network 20), along with the data bits 102a, by the memory controller 104. In such an embodiment, the ECC bits, which are received along with the data bits 102a, are re-used (e.g., the received ECC bits are selectively modified, based on the error flag 102b, and the (i) data bits 102a and (ii) the received ECC bits (with or without modifications) are included in the write data 126).

Although not illustrated in FIG. 1, the memory controller 104 comprises an appropriate component (e.g., a write module) to store the write data 126 to an appropriate location in the memory 128.

Subsequent to storing the data 102 in the memory 128 (e.g., in the form of write data 126), data 102 is read back from the memory 128, in an embodiment. Although not illustrated in FIG. 1, an appropriate component of the memory controller 104 (e.g., a read module) reads from the memory 128 the read data 130 (that was written as write data 126 earlier in the memory 128). Thus, the first 64 bits of the read data 130 correspond to the data bits 102a of the data 102, and the last eight bits of the read data 130 correspond to either (i) the ECC bits 204 or (ii) the modified ECC bits 208.

It is noted that during a memory write/store/read process (i.e., while writing the write data 126 in the memory 128, while the write data 126 is being stored in the in the memory 128, and/or while reading the read data 130 from the memory 128) of the data 102, one or more bits of the write data 126 may potentially get corrupted (i.e., error may be introduced in one or more bits of the write data 126). Accordingly, there is a probability that the read data 130 may have one or more bits that do not match with the corresponding bits of the write data 126 (e.g., due to introduction of errors in these bits). For example, (i) one or more of the data bits 102a and/or (ii) one or more of the ECC bits 204/modified ECC bits 208 of the write data 126 may potentially get corrupted in the read data 130.

The ECC module 108b receives the read data 130. The ECC module 108b comprises an ECC decoding module 132 configured to decode the read data 130. For example, the ECC decoding module 132 uses the last eight bits of the read data 130 (as these bits correspond to the ECC bits 204 or the modified ECC bits 208) to detect and/or correct potential errors in the read data 130.

As previously discussed, if there was no error in the data bits 102a of the data 102 received by the ECC module 108a, then the write data 126 includes the ECC bits 204. In such a case, the ECC decoding module 132 decodes the ECC bits in the read data 130. If an error is detected in one bit, the ECC decoding module 132 corrects such an error.

On the other hand, if there was error in the data bits 102a of the data 102 received by the ECC module 108a (i.e., if the error flag 102b was "1", in the example above), then the write data 126 includes the modified ECC bits 208. In such a case, the ECC decoding module 132 attempts to decode the modified ECC bits in the read data 130. As, for example, a large number of bits (e.g., seven bits) of the modified ECC bits 208 were flipped, an attempt to decode the read data 130 using the modified ECC bits would not be successful. In an example, the ECC decoding module 132 may have a capability to detect two bit error in the read data 130, and correct a single bit error in the read data 130. For example, if an error is detected in two bits, the ECC decoding module 132 detects such error and flags the data as corrupted.

In an example, in the memory write/store/read process of the data 102, one or more bits of the read data 130 may become corrupted. For example, one of the modified ECC bits 208 in the read data 130 may be flipped back to its original values. However, in a normal memory write/store/read process, there is a very low probability of more than one bit of the 72 bit read data 130 becoming corrupted. Accordingly, there is a very low probability of more than one bit of the modified ECC bits 208 being flipped back to their respective original values. Hence, with very high probability, in the read data 130, at least six bits of the eight bit modified ECC bits 208 will still be flipped (i.e., would still be erroneous). For example, if one bit of the 72 bit read data 130 becomes corrupted in the memory write/store/read process, then the read data 130 will still have sufficiently large number of modified ECC bits that are flipped.

Accordingly, if the ECC decoding module 132 attempts to decode the read data 130 using the modified ECC bits 208, such a decoding will not be successful with very high probability (as at least six ECC bits of the read data 130 are still flipped or erroneous, in an 8 bit ECC embodiment). That is, in an embodiment the ECC decoding module 132 will detect error in the read data 130, and such an error will be, with high probability, beyond the correction capability of the ECC decoding module 132.

In an embodiment, the ECC module 108b further comprises an error flag generation module 136. If the ECC decoding module 132 detects an error in the read data 130 that is beyond the correction capability of the ECC decoding module 132, the error flag generation module 132 generates an error flag with a value of, for example, 1 (or with other suitable combination of bits). The error flag generation module 132 appends the generated error flag with the data bits 102a from the read data 130 (i.e., appends the generated error flag with the first 64 bits of the read data 130) to generate data 140. Thus, data 140 comprises the error flag and 64 data bits. The 64 data bits in the data 140 are similar to the 64 data bits 102a of the data 102, e.g., unless one or more of the data bits 102a becomes corrupted in the memory write/store/read process. The data 140 is subsequently transmitted to an appropriate destination (e.g., a packet processing unit within the network device) for further processing. For example, if the data bits 102a were received from a network and had the associated error flag 102b indicating that the data 102 was corrupted, the data 140 will also have the corresponding error flag set to indicate the data 140 is corrupted. Based on the error flag associated with the data 140, the data 140 may be, for example, discarded, further processed, or the data bits 102a may be re-requested over the network (e.g., as the data 102 was corrupted).

Although the memory controller 104 of FIG. 1 is illustrated to include only the ECC modules 108a and 108b, the memory controller 104 may include several other components not illustrated in the figure (e.g., a write module to write data 126 to the memory 128, a read module to read data 130 from the memory 128, an encryption module for encrypting data 102 and/or data 126 before being written to the memory 128, a decryption module to decrypt data read from the memory 128, a buffer module to buffer data while the data is being written to or read from the memory, and/or the like).

Modifying the ECC bits 204 corresponding to the data bits 102a, in response to identifying that the data 102 is corrupted, has several advantages. For example, as previously discussed, modifying the ECC bits 204 helps in propagation of the error indication from the data 102 to the data 140, even though the error flag 102b is not stored in the memory 128. The intentional introduction of error in seven ECC bits, by modifying the seven ECC bits (e.g., in a eight bit ECC), acts as a practically indelible error flag and propagates the error indication from the received data 102 to the data 140.

On the other hand, if, for example, only two of the ECC bits 204 were modified (e.g., instead of seven bits), one of the two of the modified ECC bits 204 could be flipped back to its respective original value, and the ECC decoding module 132 may detect and even correct the remaining modified ECC bits. Put differently, if only two (i.e., instead of seven) of the ECC bits 204 are modified, the ECC module 108b may not detect an error (or if detected, correct the error) in the read data 130, and the data 140 may not be tagged as being corrupted (in spite of the data 102 being tagged as corrupted) by the error flag generation module 136. However, modifying seven bits in the eight bit ECC 204 provides a practically indelible mark to indicate that the data 102 is corrupted, and ensures that the data 140 will always be tagged as being corrupted if the data 102 is corrupted.

Figure 3:
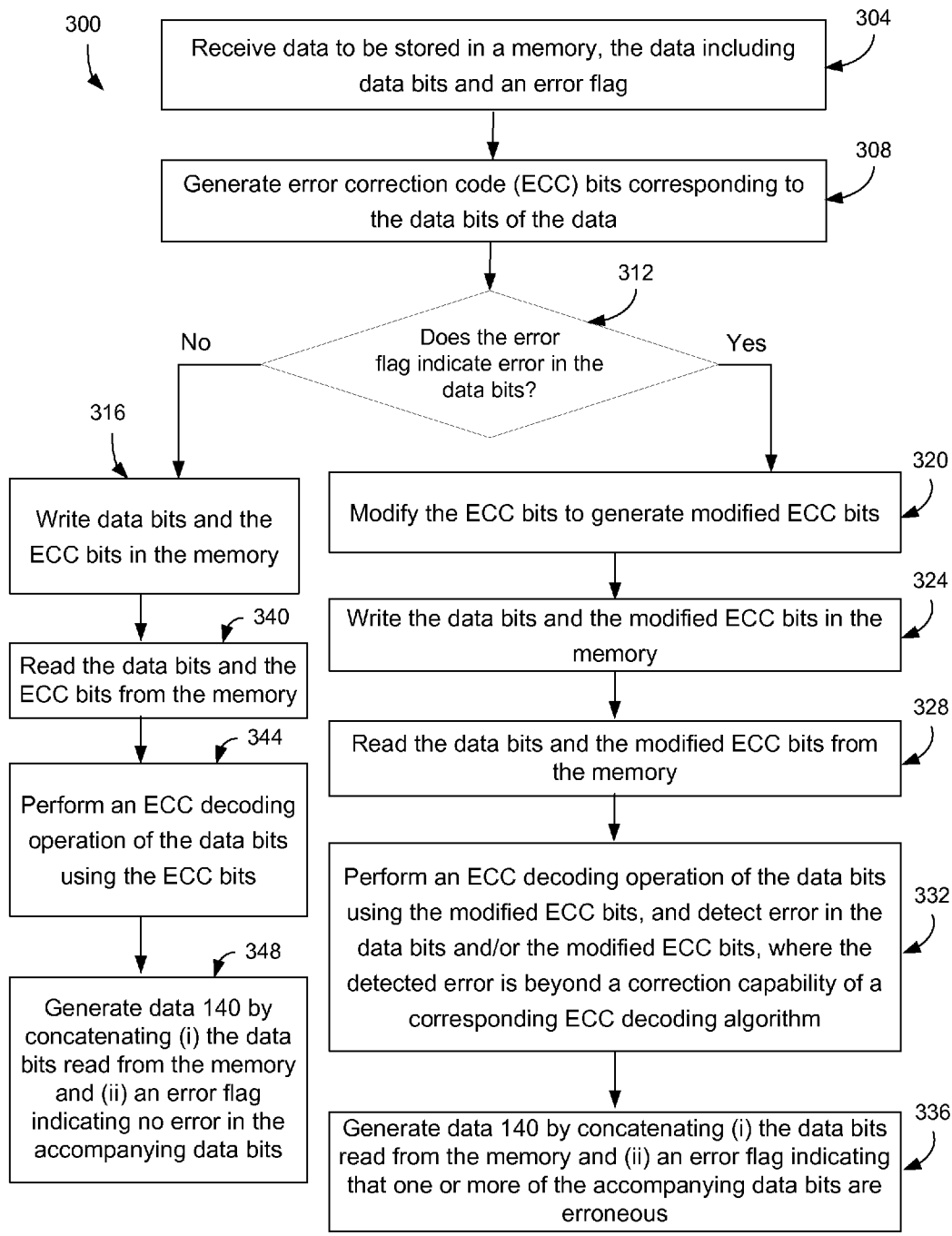
FIG. 3 illustrates an example of a method for operating the memory system of FIG. 1, in accordance with an embodiment of the present disclosure.

FIG. 3 illustrates an example of a method 300 for operating the system 10 of FIG. 1, in accordance with an embodiment of the present disclosure. At 304, data (e.g., data 102) to be stored in a memory (e.g., memory 128) is received (e.g., by the data reception module 112 of FIG. 1). The data includes data bits (e.g., data bits 102a) and a tag (e.g., the error flag 102b), as illustrated in FIG. 2A. In an example, the data bits included in the data comprises 64 data bits. In an embodiment, a value of 1 for the error flag provides an indication that one or more of the data bits are corrupted. A value of 0 for the error flag provides any indication that data bits are not corrupted, in an embodiment. Alternatively, any other suitable single bit or multi-bit code may be employed to indicate the presence or absence of corrupted data bits.

At 308, an ECC generation module (e.g., the ECC generation module 120 of FIG. 1) generates ECC bits (e.g., ECC bits 204) corresponding to the data bits of the received data. In an example, eight ECC bits are generated.

At 312, an error identification module (e.g., the error identification module 116 of FIG. 1) determines if the error flag included in the received data indicates error in the data bits of the received data.

If the error flag does not indicate any error in the data bits of the received data (i.e., if "No" at 312), then at 316, the data bits and the ECC bits are written in the memory (e.g., by an appropriate write module included in the memory controller 108a, not illustrated in FIG. 1).

If the error flag indicates presence of error in one or more of the data bits of the received data (i.e., if "Yes" at 312), then at 320, an ECC modification module (e.g., the ECC modification module 124 of FIG. 1) modifies the ECC bits to generate modified ECC bits (e.g., the modified ECC bits 208 of FIG. 2B). In an example, seven bits of the eight ECC bits are modified. In another example, at least seven bits of the eight ECC bits are modified. In yet another example, at least a threshold number of ECC bits are modified. The threshold number is, for example, three, seven or the like. Modifying an ECC bit comprises flipping a value of the ECC bit. Thus, modifying the ECC bits comprises intentionally introducing errors in the ECC bits, to preserve the information about the data 102 being corrupted.

At 324, the data bits and the modified ECC bits are written in the memory (e.g., by an appropriate write module included in the memory controller 108a, not illustrated in FIG. 1). For example, the data bits and the modified ECC bits are concatenated to form write data (e.g., write data 126), and the write data is written in the memory.

At 328, the data bits and the modified ECC bits are read from the memory (e.g., by an appropriate read module included in the memory controller 108a, not illustrated in FIG. 1). For example, the data bits and the modified ECC bits are read as read data (e.g., read data 130) from the memory.

During the memory write/storage/read process (e.g., while the data bits and the modified ECC bits are being written to, stored, and/or read back from the memory), even if one of the modified ECC bits is flipped back to its respective original value, there would still be sufficient number of ECC bits that are erroneous so that the decoded ECC would still indicate that the associated data is not valid, i.e. that it is corrupted. Accordingly, at 332, an ECC decoding operation is performed (e.g., by the ECC decoding module 132) for the data bits in the read data using the modified ECC bits, and errors in the data bits and/or the modified ECC bits are detected (as a large number of ECC bits are still flipped from their original values). In an embodiment, the detected error is beyond a correction capability of a corresponding ECC decoding algorithm operated by the ECC decoding module 132.

Based on detecting the error at 332, at 336, data 140 is generated by concatenating (i) the data bits read from the memory and (ii) an error flag indicating that one or more of the accompanying data bits are erroneous. The data 140 is then transmitted to an appropriate destination.

Referring again to operations at 316, in response to detecting no error in the data bits 102a, the data bits and the ECC bits (e.g., ECC bits 204) are written in the memory (e.g., in the form of write data 126), without modifying the ECC bits. At 340, the data bits and the ECC bits are read from the memory (e.g., in the form of read data 130). At 344, an ECC decoding operation of the data bits of the read data is performed (e.g., by the ECC decoding module 132) using the ECC bits. If a bit gets corrupted during the memory write/store/read process, such error can get corrected during the ECC decoding operation, in an embodiment. At 348, data 140 is generated (e.g., by the error flag generation module 136) by concatenating (i) the data bits read from the memory and (ii) an error flag indicating no error in the accompanying data bits. The data 140 is then transmitted to an appropriate destination (e.g., to a packet processor within or outside the network device).

The description incorporates use of the phrases "in an embodiment," or "in various embodiments," which may each refer to one or more of the same or different embodiments. Furthermore, the terms "comprising," "including," "having," and the like, as used with respect to embodiments of the present disclosure, are synonymous.

Various operations may have been described as multiple discrete actions or operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order than the described embodiment. Various additional operations may be performed and/or described operations may be omitted in additional embodiments.

Although specific embodiments have been illustrated and described herein, it is noted that a wide variety of alternate and/or equivalent implementations may be substituted for the specific embodiment shown and described without departing from the scope of the present disclosure. The present disclosure covers all methods, apparatus, and articles of manufacture fairly falling within the scope of the appended claims either literally or under the doctrine of equivalents. This application is intended to cover any adaptations or variations of the embodiment disclosed herein. Therefore, it is manifested and intended that the present disclosure be limited only by the claims and the equivalents thereof.

What is claimed is:

1. A method comprising:
   receiving data to be stored in a memory, the data including (i) data bits and (ii) a tag indicating whether one or more of the data bits are corrupted;
   generating eight error correction code (ECC) bits, separate from the tag, corresponding to the data bits of the data;
   in response to the tag indicating that one or more of the data bits are corrupted, modifying seven bits of the eight ECC bits to generate modified ECC bits, wherein the seven bits of the eight ECC bits are modified to indicate that the one or more of the data bits are corrupted, and wherein modifying the seven bits of the eight ECC bits comprises, for each of the seven bits of the eight ECC bits, flipping a value of the bit; and
   writing to the memory the data bits, including the one or more of the data bits that are corrupted, along with the modified ECC bits that are indicative of the one or more of the data bits being corrupted.

2. The method of claim 1, further comprising:
   reading the data bits and the modified ECC bits from the memory;
   subsequent to reading the data bits and the modified ECC bits, performing an ECC decoding operation of the data bits using the modified ECC bits;
   based on performing the ECC decoding operation, detecting errors in one or both (i) the data bits and (ii) the modified ECC bits that are read from the memory, wherein the detected errors are beyond a correction capability of the ECC decoding operation; and
   in response to detecting the errors, marking the data bits read from the memory as being corrupted.

3. The method of claim 2, wherein marking the data bits read from the memory as being corrupted further comprises:
   in response to detecting the errors, generating another tag to indicate that one or more of the data bits read from the memory are corrupted; and
   concatenating (i) the data bits read from the memory and (ii) the another tag to generate another data, wherein the another data is transmitted to a destination component for further processing.

4. The method of claim 2, wherein detecting errors in one or both (i) the data bits and (ii) the modified ECC bits that are read from the memory further comprises:
   detecting errors in one or both (i) the data bits and (ii) the modified ECC bits that are read from the memory, even if one of the modified ECC bits, which are read from the memory, is flipped back to a corresponding original value during one or more of (i) writing the data bits, along with the modified ECC bits, to the memory, (ii) reading the data bits and the modified ECC bits from the memory, and (iii) storing the data bits and the modified ECC bits in the memory.

5. The method of claim 1, wherein receiving the data further comprises:
   receiving the data such that the tag is in a form of an error flag.

6. The method of claim 5, further comprising:
   refraining from writing the error flag in the memory along with the data bits.

7. The method of claim 1, wherein modifying the seven bits of the eight ECC bits further comprises:
   selecting seven consecutive bits of the eight ECC bits; and
   modifying the selected seven bits of the ECC bits.

8. The method of claim 1, wherein modifying the seven bits of the eight ECC bits further comprises:

selecting seven least significant bits (LSBs) of the eight ECC bits; and
modifying the selected seven bits of the ECC bits.

9. The method of claim 1, wherein receiving the data further comprises:
receiving the data from a component that is coupled to a network, wherein the component receives the data bits from the network and generates the tag indicating that one or more of the data bits are corrupted.

10. The method of claim 1, further comprising:
while modifying the seven bits of the eight ECC bits to generate the modified ECC bits, refraining from modifying one bit of the eight ECC bits such that the one bit of the eight ECC bits is identical in both the ECC bits and the modified ECC bits.

11. The method of claim 1, wherein modifying the seven bits of the eight ECC bits to generate the modified ECC bits further comprises:
modifying exactly the seven bits of the eight ECC bits to generate the modified ECC bits.

12. A system comprising:
a memory; and
a memory controller coupled to the memory, the memory controller comprising
a data reception module configured to receive data to be stored in the memory, the data including (i) data bits and (ii) a tag indicating whether one or more of the data bits are corrupted,
an error correction code (ECC) generation module configured to generate eight ECC bits, separate from the tag, corresponding to the data bits of the data,
an ECC modification module configured to modify, in response to the tag indicating that one or more of the data bits are corrupted, seven bits of the eight ECC bits to generate modified ECC bits, wherein the seven bits of the eight ECC bits are modified to indicate that the one or more of the data bits are corrupted, wherein the ECC modification module is configured to modify the seven bits of the eight ECC bits by, for each of the seven bits of the eight ECC bits, flipping a value of the bit, and
a write module configured to write, to the memory, the data bits, including the one or more of the data bits that are corrupted, along with the modified ECC bits that are indicative of the data bits being corrupted.

13. The system of claim 12, wherein the memory controller further comprises:
a read module configured to read the data bits and the modified ECC bits from the memory;
an ECC decoding module configured to
perform an ECC decoding operation of the data bits using the modified ECC bits, subsequent to the read module reading the data bits and the modified ECC bits from the memory, and
based on performing the ECC decoding operation, detect errors in the data bits and the modified ECC bits that are read from the memory, wherein the detected errors are beyond a correction capability of the ECC decoding module; and
an error flag generation module configured to, in response to the ECC decoding module detecting the errors, mark the data bits read from the memory as being corrupted.

14. The system of claim 13, wherein the error flag generation module is configured to mark the data bits read from the memory as being corrupted by:
generating another tag to indicate that one or more of the data bits read from the memory are corrupted; and
concatenating (i) the data bits read from the memory and (ii) the another tag to generate another data, wherein the another data is transmitted by the system to a destination component for further processing of the another data.

15. The system of claim 12, wherein the memory controller further comprises:
an error detection module configured to (i) process the data received by the data reception module and (ii) identify, based on the tag included in the data, that one or more of the data bits are corrupted.

16. The system of claim 12, wherein the tag included in the data is in a form of an error flag.

17. The system of claim 16, wherein the error flag is not written in the memory along with the data bits.

18. The system of claim 12, wherein the ECC modification module is configured to modify the seven bits of the eight ECC bits by:
selecting seven consecutive bits of the eight ECC bits; and
modifying the selected seven bits of the ECC bits.

19. The system of claim 12, wherein the ECC modification module is configured to modify the seven bits of the eight ECC bits by:
selecting seven least significant bits (LSBs) of the eight ECC bits; and
modifying the selected seven bits of the ECC bits.

20. The system of claim 12, wherein:
the data reception module is configured to receive the data from a component that is coupled to a network; and
the component receives the data bits from the network and generates the tag indicating that one or more of the data bits are corrupted.

21. The system of claim 12, wherein the system is a network device, and wherein the system further comprises:
a packet reception and error detection module configured to (i) receive the data bits from a network, (ii) process the data bits, based on another eight ECC bits received from the network, to identify one or more errors in the received data bits, (iii) attach the tag to the data bits, the tag indicating that one or more of the data bits are corrupted, and (iv) transmit the data bits and the tag to the data reception module.

22. A method comprising:
receiving data to be stored in a memory, the data including (i) data bits and (ii) a tag indicating whether one or more of the data bits are corrupted;
generating eight error correction code (ECC) bits corresponding to the data bits of the data;
in response to the tag indicating that one or more of the data bits are corrupted, modifying selected bits among the eight ECC bits to generate modified ECC bits, wherein the selected bits of the eight ECC bits are modified to indicate that the one or more of the data bits are corrupted, and wherein modifying the selected bits among the eight ECC bits comprises, for each of the selected bits among the eight ECC bits, flipping a value of the bit; and
writing, to the memory, the data bits, including the one or more of the data bits that are corrupted, along with the modified ECC bits that are indicative of the one or more of the data bits being corrupted.

23. The method of claim 21, wherein modifying the selected bits among the eight ECC bits comprises modifying two or more bits among the eight ECC bits to generate the modified ECC bits.

* * * * *